United States Patent
Zou et al.

(10) Patent No.: US 11,128,957 B2
(45) Date of Patent: Sep. 21, 2021

(54) MICRO-SPEAKER, SPEAKER DEVICE AND ELECTRONIC APPARATUS

(71) Applicant: Goertek Inc., Shandong (CN)

(72) Inventors: Quanbo Zou, Shandong (CN); Zhe Wang, Shandong (CN); Jun Li, Shandong (CN)

(73) Assignee: GOERTEK INC., Shandong (CN)

( * ) Notice: Subject to any disclaimer, the term of this patent is extended or adjusted under 35 U.S.C. 154(b) by 0 days.

(21) Appl. No.: 15/769,798

(22) PCT Filed: Oct. 21, 2015

(86) PCT No.: PCT/CN2015/092406
§ 371 (c)(1),
(2) Date: Apr. 20, 2018

(87) PCT Pub. No.: WO2017/066934
PCT Pub. Date: Apr. 27, 2017

(65) Prior Publication Data
US 2018/0317017 A1    Nov. 1, 2018

(51) Int. Cl.
*H04R 17/00* (2006.01)
*H04R 31/00* (2006.01)
(Continued)

(52) U.S. Cl.
CPC .......... *H04R 17/00* (2013.01); *H01L 41/083* (2013.01); *H01L 41/29* (2013.01); *H04R 1/02* (2013.01);
(Continued)

(58) Field of Classification Search
CPC .............. H04R 17/00; H01L 41/083
(Continued)

(56) References Cited

U.S. PATENT DOCUMENTS 4,978,880 A * 12/1990 Causse .................. H04R 1/06
310/324
5,973,441 A * 10/1999 Lo .......................... H01L 41/098
310/330

(Continued)

FOREIGN PATENT DOCUMENTS

| CN | 103493510 A | 1/2014 |
| CN | 103535053 A | 1/2014 |

OTHER PUBLICATIONS

International Searching Authority, International Search Report and Written Opinion for International Application No. PCT/CN2015/092406, dated Jul. 5, 2016, 6 pages, State Intellectual Property Office of the P.R.C., China.

*Primary Examiner* — Ahmad F. Matar
*Assistant Examiner* — Jirapon Intavong
(74) *Attorney, Agent, or Firm* — Alston & Bird LLP

(57) ABSTRACT

A micro-speaker, the manufacturing method thereof, a speaker device and an electronic apparatus are described herein. The micro-speaker comprises a case, wherein the case has an opening; and a piezoelectric layer, wherein one or more electrodes are provided on the piezoelectric layer, and wherein the piezoelectric layer is pre-buckled in its rest position, wherein the piezoelectric layer covers the opening and is bonded onto the case, to form a speaker rear cavity together with the case. The micro-speaker of the present invention has a relatively low speaker profile.

20 Claims, 4 Drawing Sheets

(51) Int. Cl.
  *H01L 41/083* (2006.01)
  *H01L 41/29* (2013.01)
  *H04R 1/02* (2006.01)
(52) U.S. Cl.
  CPC ....... *H04R 31/00* (2013.01); *H04R 2201/003* (2013.01); *H04R 2201/401* (2013.01); *H04R 2307/023* (2013.01); *H04R 2307/025* (2013.01); *H04R 2499/11* (2013.01); *H04R 2499/15* (2013.01)
(58) Field of Classification Search
  USPC .......................................................... 381/190
  See application file for complete search history.

(56) References Cited

U.S. PATENT DOCUMENTS

| | | | |
|---|---|---|---|
| 7,474,180 B2 * | 1/2009 | Bintoro | F15C 5/00 335/78 |
| 8,114,497 B2 | 2/2012 | Chen et al. | |
| 8,275,158 B2 | 9/2012 | Kim et al. | |
| 8,335,329 B2 | 12/2012 | Kim et al. | |
| 8,401,220 B2 | 3/2013 | Kim et al. | |
| 8,811,636 B2 | 8/2014 | Stephanou et al. | |
| 9,070,861 B2 | 6/2015 | Bibl et al. | |
| 9,332,353 B2 | 5/2016 | Ando | |
| 2005/0147264 A1 * | 7/2005 | Yeo | H04R 17/00 381/190 |
| 2006/0158064 A1 * | 7/2006 | Asakawa | H04R 1/2842 310/328 |
| 2008/0193307 A1 * | 8/2008 | Elata | F04B 19/006 417/474 |
| 2010/0104116 A1 * | 4/2010 | Liou | H04R 19/013 381/191 |
| 2011/0038495 A1 | 2/2011 | Jeong et al. | |
| 2012/0087522 A1 * | 4/2012 | Lee | H04R 17/005 381/190 |
| 2013/0259274 A1 * | 10/2013 | Hayashi | H04M 1/03 381/190 |
| 2016/0212526 A1 * | 7/2016 | Salvatti | H04R 1/44 |

* cited by examiner

MICRO-SPEAKER, SPEAKER DEVICE AND ELECTRONIC APPARATUS

CROSS-REFERENCE TO RELATED APPLICATIONS

This application is a National Stage of International Application No. PCT/CN2015/092406, filed on Oct. 21, 2015, which is hereby incorporated by reference in its entirety.

BACKGROUND

Technical Field

The present invention relates to the technical field of speaker, and more specifically, relates to a micro-speaker, a speaker device, and an electronic apparatus.

Description of Related Art

In the micro-speaker of the prior art, a piezoelectric thin film is used as an actuator, which actuates an membrane to vibrate to produce a sound pressure output.

For example, the U.S. Pat. No. 8,811,636 B2 filed on Nov. 29, 2011 with a title of "Microspreaker with piezoelectric, metal and dielectric membrane" discloses an electromechanical micro-speaker, which is hereby incorporated as a whole herein as reference.

For example, the U.S. Pat. No. 8,275,158 filed on Aug. 4, 2010 with a title of "Piezoelectric micro speaker" discloses a piezoelectric micro-speaker, which is hereby incorporated as a whole herein as reference.

For example, the U.S. Pat. No. 8,401,220 filed on Mar. 31, 2010 with a title of "Piezoelectric micro speaker with curved lead wires and method of manufacturing the same" discloses a piezoelectric micro-speaker and a method of manufacturing the same, which is hereby incorporated as a whole herein as reference.

For example, the U.S. Patent Application No. US2011/0038495 filed on Feb. 2, 2010 with a title of "Piezoelectric micro speaker and method of manufacturing the same" discloses a piezoelectric micro-speaker and a method of manufacturing the same, which is hereby incorporated as a whole herein as reference.

For example, the U.S. Pat. No. 8,335,329 filed on Sep. 9, 2010 with a title of "Piezoelectric speaker and method of manufacturing the same" discloses a piezoelectric micro-speaker and a method of manufacturing the same, which is hereby incorporated as a whole herein as reference.

For example, the U.S. Pat. No. 8,114,497 filed on Aug. 20, 2008 with a title of "Piezoelectric microphone, speaker, microphone-speaker integrated device and manufacturing method thereof" discloses a piezoelectric microphone, a microphone-speaker integrated device and a manufacturing method thereof, which is hereby incorporated as a whole herein as reference.

BRIEF SUMMARY

One object of this invention is to provide a new technical solution for a micro-speaker.

According to an embodiment of the present invention, there is provided a micro-speaker, including: a case, wherein the case has an opening; and a piezoelectric layer, wherein one or more electrodes are provided on the piezoelectric layer, wherein the piezoelectric layer is pre-buckled in its rest position, wherein the piezoelectric layer covers the opening and is bonded onto the case, to form a speaker rear cavity together with the case.

Preferably, the electrodes are provided on both surfaces of the piezoelectric layer, respectively.

Preferably, the piezoelectric layer is bonded onto the case via a bonding layer.

Preferably, the speaker rear cavity is connected to the outside.

Preferably, the speaker rear cavity is sealed. Preferably, the air pressure in the speaker rear cavity is lower than that outside. Preferably, absorbent for absorbing gas or moisture are provided inside the speaker rear cavity.

Preferably, the piezoelectric layer is a piezoelectric plate or a piezoelectric thin film.

Preferably, the piezoelectric layer is used for deforming under voltage applied onto the electrodes, to produce sound pressure output.

Preferably, the piezoelectric layer includes PZT piezoelectric ceramic.

Preferably, the case includes metal. Preferably, the metal is brass. Preferably, the metal acts as at least one electrode among the electrodes.

Preferably, the piezoelectric layer and the case have different coefficients of thermal expansion.

According to another embodiment of the present invention, there is provided a speaker device, comprising one or more micro-speaker according to the present invention.

According to another embodiment of the present invention, there is provided an electronic apparatus, including a speaker device according to the present invention.

According to another embodiment of the present invention, there is provided a method for manufacturing a micro-speaker, comprising: forming a piezoelectric layer; forming one or more electrodes on the piezoelectric layer; and bonding the piezoelectric layer onto a case, to form a speaker rear cavity together with the case, wherein the piezoelectric layer is pre-buckled in its rest position, for deforming under voltage applied onto the electrodes, to produce sound pressure output.

Preferably, the electrodes are formed on both surfaces of the piezoelectric layer. Preferably, the method further comprises: singulating the piezoelectric layer with electrodes; bonding the piezoelectric layer onto the case via an bonding layer under a temperature above the room temperature, wherein the piezoelectric layer and the case have different coefficient of thermal expansion; and cooling the case and the piezoelectric layer, so that the piezoelectric layer is bent at an area other than the bonding area between the piezoelectric layer and the case.

Preferably, the speaker rear cavity is sealed, and the method further comprises: providing absorbent for absorbing gas or moisture inside the speaker rear cavity.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that content which is not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

BRIEF DESCRIPTION OF THE VARIOUS EMBODIMENTS

Figure 1A:
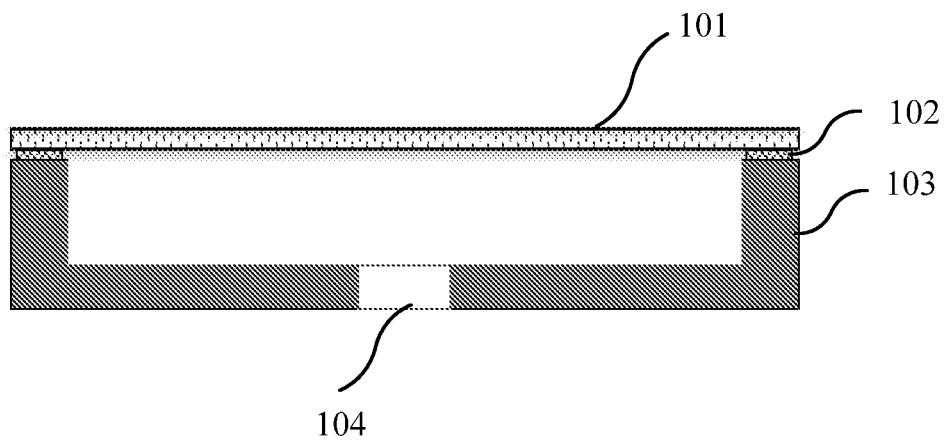
FIGS. 1A-1C show a manufacturing process of a micro-speaker according to an embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described below with reference to the drawings.

Figure 1B:
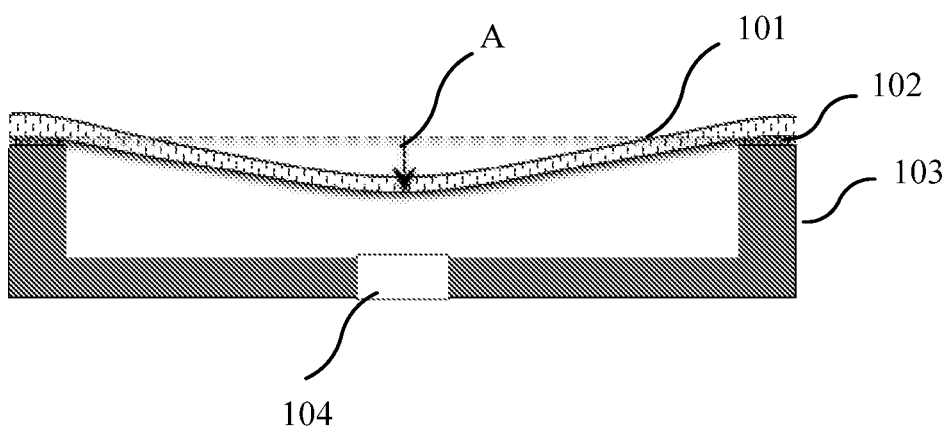
Figure 1C:
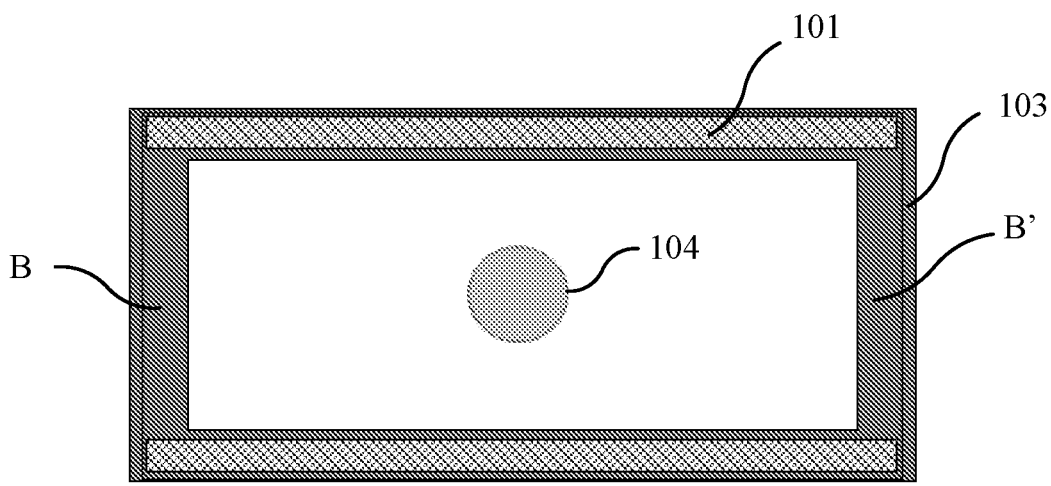

FIGS. 1A-1C show a manufacturing process for a micro-speaker according to an embodiment of the present invention.

FIG. 1A shows a piezoelectric layer 101, a bonding layer 102, a case 103 and an opening 104.

As shown in FIG. 1A, a piezoelectric layer 101 is formed firstly. The piezoelectric layer 101 can be a piezoelectric plate or a piezoelectric thin film, for example. The piezoelectric layer can be thinned. The piezoelectric layer can be a PZT piezoelectric ceramic, for example.

For example, one or more electrodes (not shown) can be provided on the piezoelectric layer. The electrodes can be provided on both surfaces of the piezoelectric layer. For example, the thickness of the piezoelectric layer is 20~100 µm. The electrode can be provided on only one surface, and the case 103 is used to act as another electrode. Alternatively, for example, the electrodes can be provided on the side surfaces of the piezoelectric layer 101.

For example, a piezoelectric layer of large size is formed first. Then, the piezoelectric layer is singlated, to form piezoelectric layers for each micro-speaker.

Next, the piezoelectric layer is placed onto the case 103. The case 103 is open (opening) on the side receiving the piezoelectric layer (opening).

The case 103 can be conductive, for example. In this case, the case 103 is used as an electrode of the piezoelectric layer, or leads for an electrode. For example, the case is of metal, such as brass.

Alternatively, the case 103 is of other material, such as semiconductor material, dielectric material and so on.

For example, the piezoelectric layer 101 is bonded onto the case 103 via a bonding layer 102. For example, the bonding layer 102 is conductive. For example, the bonding layer 102 can be an eutectic solder paste.

As shown in FIG. 1A, the piezoelectric layer 101 and the case 103 form a speaker rear cavity. In the present invention, the piezoelectric layer 101 wherein the piezoelectric layer is pre-buckled in its rest position, for deforming under voltage applied onto the electrodes, to produce sound pressure output. It should be understood by a person skilled in the art that other layers can be provided on the piezoelectric layer 101, to produce sound pressure output and/or improve the quality of sound pressure output. It should be understood by a person skilled in the art that a difference between the present invention and the prior art lies in that in the present invention, on the assumption that the other layers are excluded, the piezoelectric layer 101 and the case 103 (including the bonding layer therebetween) can constitute a speaker rear cavity, to produce sound pressure output.

The speaker profile can be lowered, for example, by directly using a piezoelectric layer to form a rear cavity.

Alternatively, for example, since a piezoelectric layer can directly be used to produce sound pressure output without using the piezoelectric layer to drive an additional membrane, the power consumption of a micro-speaker can be lowered under an equivalent condition, compared with the prior art.

For example, since a piezoelectric layer such as PZT ceramic can be used directly as a vibrating membrane, the cost can be lowered under an equivalent condition, compared with the prior art.

The piezoelectric layer 101 can be bonded onto the case 103 under a temperature above the room temperature. Then, the piezoelectric layer 101 and the case 103 are cooled to room temperature. In an example, the piezoelectric layer 101 and the case 103 have different coefficient of thermal expansion. In such a situation, the piezoelectric layer 101 is pre-buckled in its rest position. As shown in FIG. 1B, the peak amplitude of the bending is A, for example.

In this invention, since the piezoelectric layer 101 is bent, it can vibrate from a relatively low position (for example, the position A shown in FIG. 1B which is lower than the profile of the case). Accordingly, in this situation, the profile of the micro-speaker can further be lowered.

In the example shown in FIGS. 1A-1C, the case 103 has an opening 104 at its bottom. The speaker rear cavity can be connected to the outside via the opening 104. Furthermore, as shown in FIG. 1C, the bonding layer 102 are not provided at the B, B' sides of the case 103. The speaker rear cavity can also be connected to the outside via the B, B' sides.

Figure 2A:
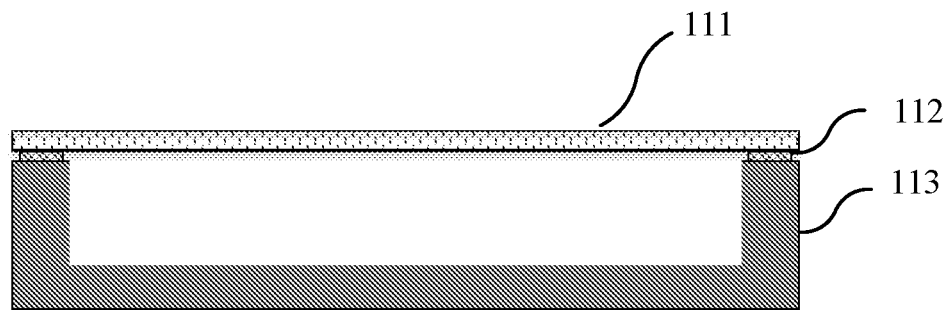
FIGS. 2A-2C show a manufacturing process of a micro-speaker according to another embodiment of the present invention.
Figure 2B:
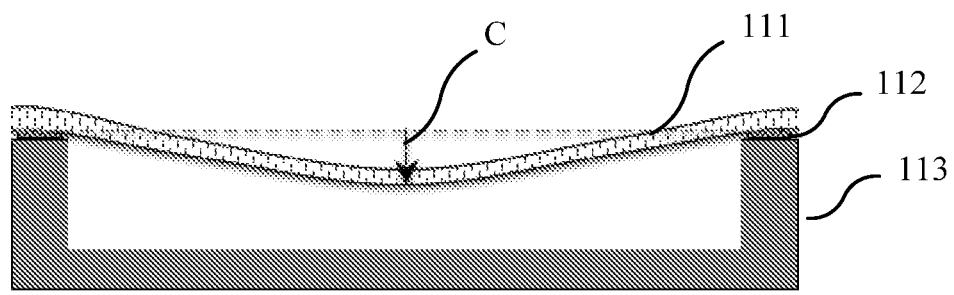
Figure 2C:
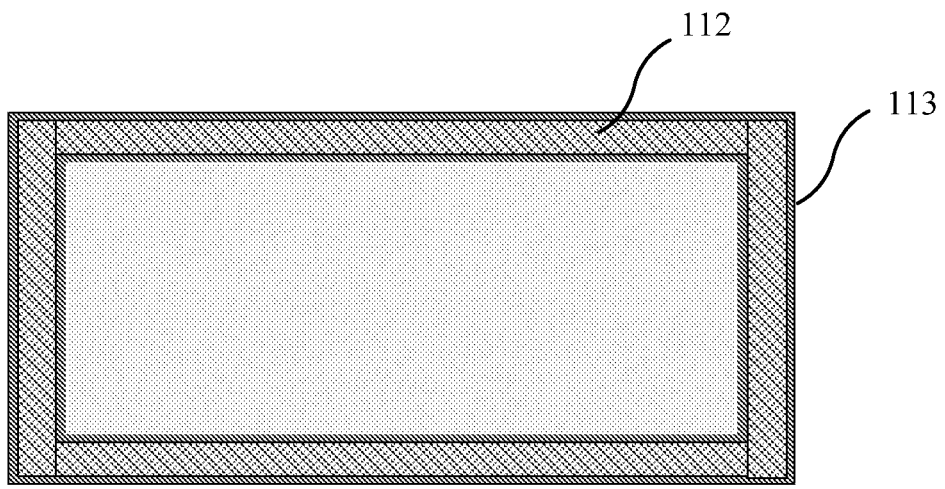

FIGS. 2A-2C show a manufacturing process for a micro-speaker according to another embodiment of the present invention.

FIGS. 2A-2C show a piezoelectric layer 111, a bonding layer 112 and a case 113. The difference between the embodiment of FIGS. 2A-2C and the embodiment of FIGS. 1A-1C lies in that, in FIGS. 2A-2C, the speaker rear cavity formed by the piezoelectric layer 111 and the case 113 is sealed.

In an example, the piezoelectric layer 111 is bonded onto to the case 113 under a relatively high temperature. Then, they are cooled to room temperature. In this situation, the air pressure inside the speaker rear cavity is lower than the air pressure outside, so that the profile of the micro-speaker can be further lowered.

For example, absorbent for absorbing gas or moisture can be provided inside the speaker rear cavity. For example, gas absorbent such as Ti can be coated on the inner wall of the case 113. For example, the air pressure inside the speaker rear cavity can further be lowered by means of the gas absorbent. For example, the inner wall of the case is kept from corrosion by using the moisture absorbent.

Figure 3:
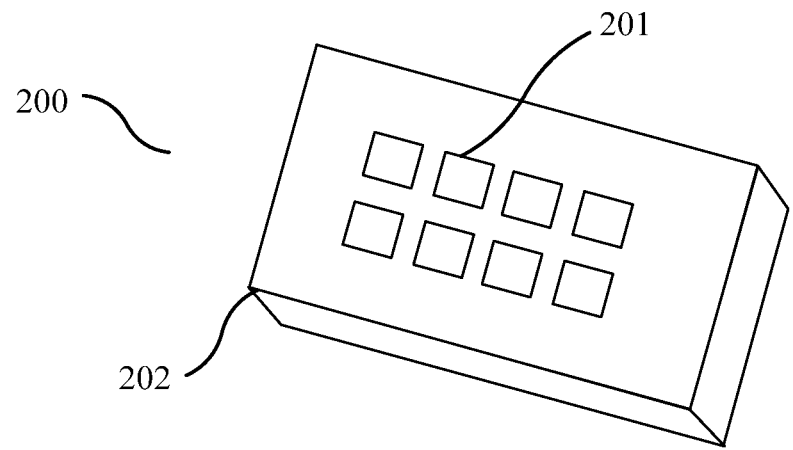
FIG. 3 shows a speaker device according to an embodiment of the present invention.

FIG. 3 shows a speaker device 200 according to an embodiment of the present invention. The speaker device 200 can, for example, comprises a housing 202 and one or more micro-speaker 201. The micro-speaker 201 can be a micro-speaker as shown in FIGS. 1A-1C or FIGS. 2A-2C. The micro-speakers 201 are arranged into array, and are connected to an outer interface of the speaker device 200 via leads (not shown). The speaker device 200 can, for example, be a module or unit in an electronic apparatus.

Figure 4:
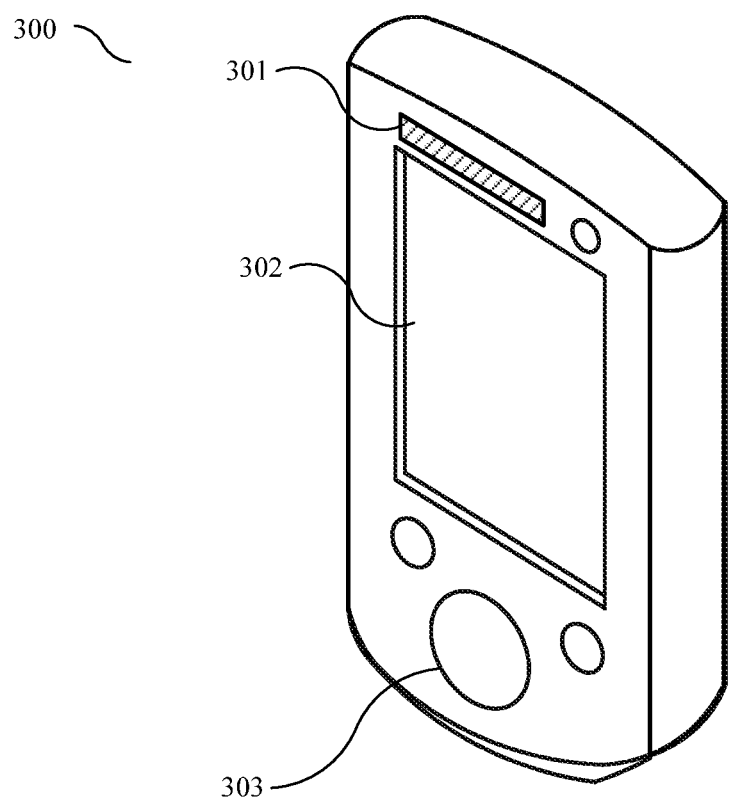
FIG. 4 shows an electronic apparatus according to an embodiment of the present invention.

FIG. 4 shows an electronic apparatus 300 according to an embodiment of the present invention. The electronic apparatus 300 can, for example, be a multimedia apparatus such as a smart phone, pad and so on. The electronic apparatus 300 comprises the speaker device 301 according to the present invention. For example, the electronic apparatus 300 can further comprises a screen 302 and buttons 303.

Figure 5:
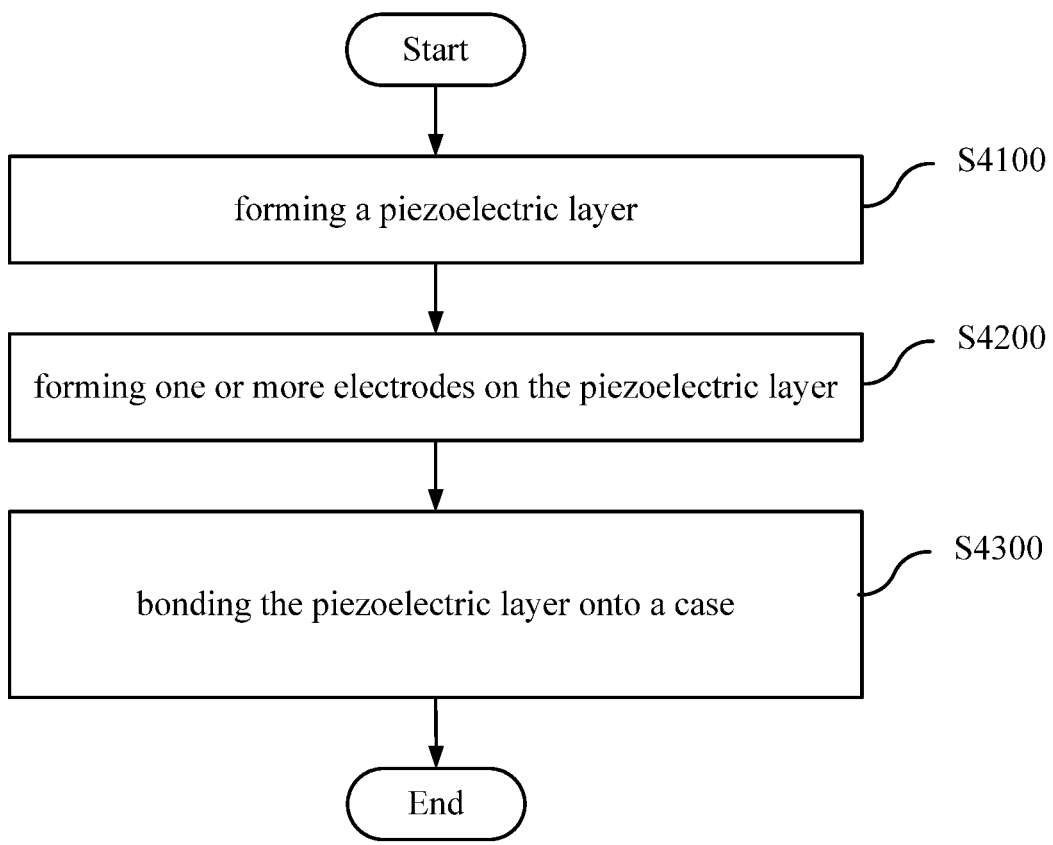
FIG. 5 shows a flow chart of an method for manufacturing a micro-speaker according to an embodiment of the present invention.

FIG. 5 shows a method for manufacturing a micro-speaker according to an embodiment of the present invention. The processes shown in FIGS. 1A-1C or FIGS. 2A-2C can be used in the method of FIG. 5. These repeated contents can be omitted in the description of FIG. 5.

As shown in FIG. 5, at step S4100, a piezoelectric layer is formed.

At step S4200, one or more electrodes are formed on the piezoelectric layer.

For example, the electrodes are formed on both surfaces of the piezoelectric layer, respectively. For example, the piezoelectric layer with electrodes can be singulated.

At step S4300, the piezoelectric layer is bonded onto a case, to form a speaker rear cavity together with the case. The piezoelectric layer is pre-buckled in its rest position, for deforming under voltage applied onto the electrodes, to produce sound pressure output.

In an example, the piezoelectric layer is bonded onto the case via an bonding layer under a temperature above the room temperature. The piezoelectric layer and the case have different coefficient of thermal expansion. When the case and the piezoelectric layer are cooled, the piezoelectric layer is pre-buckled in its rest position.

In an example, the speaker rear cavity is sealed.

In an example, absorbent for absorbing gas or moisture can be provided inside the speaker rear cavity.

In this invention, the piezoelectric layer is used for deforming under voltage applied onto the electrodes, to produce sound pressure output.

In this invention, since the piezoelectric layer can be directly used as a vibrating membrane, the profile of a micro-speaker can be lowered.

Alternatively, the present invention can achieve a better sound pressure attribute easily.

Alternatively, the power consumption can be lowered through the present invention. For example, the inventors have made tests on the micro-speaker according to the present invention and have found that they have better characteristics such as power consumption than that of the prior art.

In a first test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 5 mm, the effective length is 11 mm, and the thickness is 6 µm. The speaker rear cavity is connected to the outside. The edges of the piezoelectric layer in the width direction are bonded onto the case. Under the applied voltage of 30 V, the resonant frequency Fr is 691 Hz and the power consumption under the resonant frequency is 0.317 W.

In a second test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 7 mm, the effective length is 14 mm, and the thickness is 12 µm. The speaker rear cavity is connected to the outside. The edges of the piezoelectric layer in the width direction are bonded onto the case. Under the applied voltage of 30 V, the resonant frequency Fr is 705 Hz and the power consumption under the resonant frequency is 0.288 W.

In a third test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 5 mm, the effective length is 11 mm, and the thickness is 30 µm. The speaker rear cavity is connected to the outside. The edges of the piezoelectric layer in the length direction are bonded onto the case. Under the applied voltage of 30 V, the resonant frequency Fr is 714 Hz and the power consumption under the resonant frequency is 0.066 W.

In a fourth test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 7 mm, the effective length is 14 mm, and the thickness is 50 µm. The speaker rear cavity is connected to the outside. The edges of the piezoelectric layer in the length direction are bonded onto the case. Under the applied voltage of 30 V, the resonant frequency Fr is 735 Hz and the power consumption under the resonant frequency is 0.072 W.

In a fifth test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 5 mm, the effective length is 11 mm, and the thickness is 6 µm. The speaker rear cavity is sealed. Under the applied voltage of 30 V, the resonant frequency Fr is 691 Hz and the power consumption under the resonant frequency is 0.317 W.

In a sixth test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 7 mm, the effective length is 14 mm, and the thickness is 12 µm. The speaker rear cavity is sealed. Under the applied voltage of 30 V, the resonant frequency Fr is 705 Hz and the power consumption under the resonant frequency is 0.288 W.

In a seventh test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 5 mm, the effective length is 11 mm, and the thickness is 30 μm. The speaker rear cavity is sealed. Under the applied voltage of 30 V, the resonant frequency Fr is 714 Hz and the power consumption under the resonant frequency is 0.184 W.

In a fourth test, a piezoelectric layer is formed by using a PZT-5R piezoelectric ceramic, and a case is formed by using metal (copper). The piezoelectric layer and the copper have different coefficients of thermal expansion. The effective width of the piezoelectric layer is 7 mm, the effective length is 14 mm, and the thickness is 50 μm. The speaker rear cavity is sealed. Under the applied voltage of 30 V, the resonant frequency Fr is 735 Hz and the power consumption under the resonant frequency is 0.175 W.

The above tests just list several data under consideration. Generally, the power consumption of a micro-speaker is larger than 0.5 W. From the test data given as above, it can be seen that the power consumption of the present invention is relatively low.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for manufacturing a micro-speaker, the method comprising the steps of:
    forming a piezoelectric layer;
    forming one or more electrodes on both surfaces of the piezoelectric layer;
    bonding a periphery of the piezoelectric layer directly onto a case, to form a speaker rear cavity together with the case;
    singulating the piezoelectric layer with the one or more electrodes; and
    cooling the case and the piezoelectric layer, so that the piezoelectric layer is bent at an area other than a bonding area between the piezoelectric layer and the case and usable as a vibrating membrane,
    wherein:
        the bent piezoelectric layer is pre-buckled towards an inside of the case in a rest position of the piezoelectric layer, for deforming under voltage applied onto the one or more electrodes, to produce sound pressure output as the vibrating membrane,
        the bonding of the periphery of the piezoelectric layer directly onto the case occurs under a temperature above a room temperature, and
        the piezoelectric layer and the case have different coefficients of thermal expansion such that an operating resonant frequency of the micro-speaker is no more than 735 hertz (Hz).

2. The method according to claim 1, wherein the speaker rear cavity is sealed, and the method further comprises: providing absorbent for absorbing gas or moisture inside the speaker rear cavity.

3. A micro-speaker comprising:
    a case having an opening; and
    a piezoelectric layer covering the opening and having a periphery of the piezoelectric layer bonded directly onto the case, to form a speaker rear cavity together with the case that is used as a vibrating membrane,
    wherein:
        the piezoelectric layer is singulated with one or more electrodes positioned on both surfaces of the piezoelectric layer,
        the piezoelectric layer is pre-buckled, via cooling, so that the piezoelectric layer is bent at an area other than a bonding area between the piezoelectric layer and the case and usable as the vibrating membrane,
        the bent piezoelectric layer is pre-buckled towards an inside of the case in a rest position of the piezoelectric layer, for deforming under voltage applied onto the one or more electrodes, to produce sound pressure output as the vibrating membrane,
        the bonding of the periphery of the piezoelectric layer directly onto the case occurs under a temperature above a room temperature, and
        the piezoelectric layer and the case have different coefficients of thermal expansion such that an operating resonant frequency of the micro-speaker is no more than 735 Hz.

4. The micro-speaker of claim 3, wherein the speaker rear cavity is connected to the outside.

5. The micro-speaker of claim 3, wherein the speaker rear cavity is sealed.

6. The micro-speaker of claim 5, wherein an air pressure in the speaker rear cavity is lower than that outside.

7. The micro-speaker of claim 5, wherein absorbent for absorbing gas or moisture are provided inside the speaker rear cavity.

8. The micro-speaker of claim 3, wherein the piezoelectric layer is a piezoelectric plate or a piezoelectric thin film.

9. The micro-speaker of claim 3, wherein the piezoelectric layer is used for deforming under voltage applied onto the one or more electrodes, to produce sound pressure output.

10. The micro-speaker of claim 3, wherein the piezoelectric layer includes PZT piezoelectric ceramic.

11. The micro-speaker of claim 3, wherein the case includes metal.

12. The micro-speaker of claim 11, wherein the metal is brass.

13. The micro-speaker of claim 11, wherein the metal acts as at least one electrode among the one or more electrodes.

14. The micro-speaker of claim 3, wherein the micro-speaker is housed in a speaker device.

15. The micro-speaker of claim 13, wherein the speaker device is housed in an electronic apparatus.

16. The micro-speaker of claim 3, wherein a width of the piezoelectric layer is between 5 mm and 7 mm.

17. The micro-speaker of claim 3, wherein a thickness of the piezoelectric layer is between 6 μm and 50 μm.

18. The micro-speaker of claim 3, wherein a length of the piezoelectric layer is between 11 mm and 14 mm.

19. The micro-speaker of claim 3, wherein the piezoelectric layer comprises copper.

20. The micro-speaker of claim 3, wherein a power consumption of the micro-speaker is below 0.4 watts.

* * * * *